US012506054B2

(12) United States Patent
Clemente et al.

(10) Patent No.: US 12,506,054 B2
(45) Date of Patent: Dec. 23, 2025

(54) ELECTRONIC DEVICE TOPSIDE COOLING

(71) Applicant: Texas Instruments Incorporated, Dallas, TX (US)

(72) Inventors: Laura May Antoinette Dela Paz Clemente, Mabalacat (PH); James Raymond Maliclic Baello, Pampanga (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 129 days.

(21) Appl. No.: 18/453,981

(22) Filed: Aug. 22, 2023

(65) Prior Publication Data

US 2023/0395471 A1    Dec. 7, 2023

Related U.S. Application Data

(62) Division of application No. 16/711,753, filed on Dec. 12, 2019, now Pat. No. 11,742,266.

(51) Int. Cl.
*H01L 23/495*    (2006.01)
*H01L 23/31*    (2006.01)
*H01L 25/07*    (2006.01)

(52) U.S. Cl.
CPC .... *H01L 23/49568* (2013.01); *H01L 23/3107* (2013.01); *H01L 23/49503* (2013.01); *H01L 23/49517* (2013.01); *H01L 23/49562* (2013.01); *H01L 25/074* (2013.01)

(58) Field of Classification Search
CPC ......... H01L 23/49568; H01L 23/49503; H01L 23/49517; H01L 24/32; H01L 2224/32245; H01L 24/40
See application file for complete search history.

(56) References Cited

U.S. PATENT DOCUMENTS

| | | | |
|---|---|---|---|
| 10,418,294 B1 | 9/2019 | Clemente et al. | |
| 11,075,185 B2 * | 7/2021 | Hong | ................ H01L 23/49562 |
| 2008/0142949 A1 | 6/2008 | Ancheta et al. | |
| 2009/0294934 A1 | 12/2009 | Shi et al. | |
| 2010/0133674 A1 | 6/2010 | Herbert et al. | |
| 2011/0024785 A1 | 2/2011 | Ng et al. | |
| 2014/0273344 A1 | 9/2014 | Terrill et al. | |

* cited by examiner

*Primary Examiner* — Fernando L Toledo
*Assistant Examiner* — Adam S Bowen
(74) *Attorney, Agent, or Firm* — Ronald O. Neerings; Frank D. Cimino

(57) ABSTRACT

A method comprises removing a portion of molding compound from a side of a package structure by a laser ablation process to create an opening that exposes a portion of a conductive clip, depositing solder paste on the exposed portion of the conductive clip, and reflowing the solder paste. The laser ablation process in one example is a pulsed laser ablation process that includes raster scanning a laser along a portion of the side of the package structure to create the opening. Depositing the solder paste in one example includes performing a dispense process or a screening process that deposits solder paste in the opening onto the exposed portion of the conductive clip.

21 Claims, 12 Drawing Sheets

ELECTRONIC DEVICE TOPSIDE COOLING

CROSS-REFERENCE TO RELATED APPLICATIONS

The present application is a divisional of application Ser. No. 16/711,753 filed Dec. 12, 2019, now U.S. patent Ser. No. 11/742,266, and is hereby incorporated herein by reference in its entirety.

BACKGROUND

Integrated circuits and other packaged electronic devices have pins, leads, or other conductive features for soldering to a host printed circuit board (PCB) to electrically connect component terminals inside the device to other components or circuitry of the PCB. The leads are typically located along two or more sides of the device package. Thermal pads can be located along the bottom of the electronic device package for soldering to conductive pads of the host PCB to draw heat away from the electronic device. The heat transfer performance can be limited by the size of the thermal pad, as well as by the quality of the solder connection to the host PCB. The bottom side of the device package, however, may be limited in terms of usable thermal pad area in view of any applicable isolation spacing requirements between a given thermal pad and other bottom side thermal pads and/or device leads. Top side cooling can enhance heat removal, alone or in combination with bottom side cooling through thermal pads. Thermally conductive clips or heat slugs can be assembled in a packaged electronic device, with a topside exposed through a package molding compound. For example, a heat slug can be mounted to a top side of a clip to create a topside cooled clip quad flat no-lead (QFN) device. After molding, a mechanical buffing process is performed to expose the heat slug, followed by a post-mold matte tin (Sn) plating process. The mechanical buffing, however, leaves imperfections in the exposed heat slug, making it difficult to subsequently solder a heatsink to the heat slug. Plating facilitates subsequent soldering of cooling fins or other heatsink device to the heat slug. In other solutions, mechanical grinding is performed on a lead frame strip to expose a top clip, followed by matte Sn plating. Mechanical buffing and post-mold plating solutions add cost to the device fabrication process and cannot be used with an assembly line having no post-mold plating capability.

SUMMARY

According to one aspect, a method includes removing a portion of molding compound from a side of a package structure to create an opening that exposes a portion of a conductive clip, as well as depositing solder paste on the exposed portion of the conductive clip, and reflowing the solder paste. In one example, the molding compound is removed by laser ablation to create the opening before depositing the solder paste. In one example, the solder paste deposition includes performing a dispense process that dispenses the solder paste in the opening onto the exposed portion of the conductive clip. In another example, the solder paste deposition includes performing a screening process that deposits the solder paste in the opening onto the exposed portion of the conductive clip.

According to another aspect, an electronic device includes a semiconductor die having an electronic component, a conductive clip on a side of the semiconductor die, a solder structure on a side of the conductive clip, and a package structure that encloses the semiconductor die and the conductive clip. The package structure includes a side that exposes a portion of the solder structure. The electronic device in one example further includes a first lead exposed along a second side of the package structure, and a second lead exposed along the second side of the package structure. In one implementation, the electronic device also includes a die attach pad having a first side exposed along a second side of the package structure, as well as a second semiconductor die with a first side on the die attach pad, a second side, and a second electronic component. The electronic device in this example includes a second conductive clip having a first side on the second side of the second semiconductor die, and a second side on a second side of the semiconductor die, where the second conductive clip is coupled to the first lead and the conductive clip is coupled to the second lead.

In another aspect, an electronic device includes a package structure having a first side that includes an opening, and an opposite second side, as well as a solder structure in the opening. The solder structure is exposed along the first side of the package structure. The electronic device also includes a die attach pad having a first side exposed along the second side of the package structure, and first and second leads exposed along the second side of the package structure. The electronic device also includes a first transistor having a drain coupled to the solder structure and to the second lead, and a source coupled to the first lead, as well as a second transistor having a drain coupled to the first lead, and a source coupled to the die attach pad. In one example, the electronic device further includes a control circuit in the package structure, having a first output coupled to a gate of the first transistor and a second output coupled to a gate of the second transistor. In one example, the electronic device also includes a conductive clip coupled to the drain of the first transistor, the solder structure, and the second lead. In one implementation, the electronic device also includes a second conductive clip coupled to the drain of the second transistor, the first lead, and the source of the first transistor.

DETAILED DESCRIPTION

Figure 1:
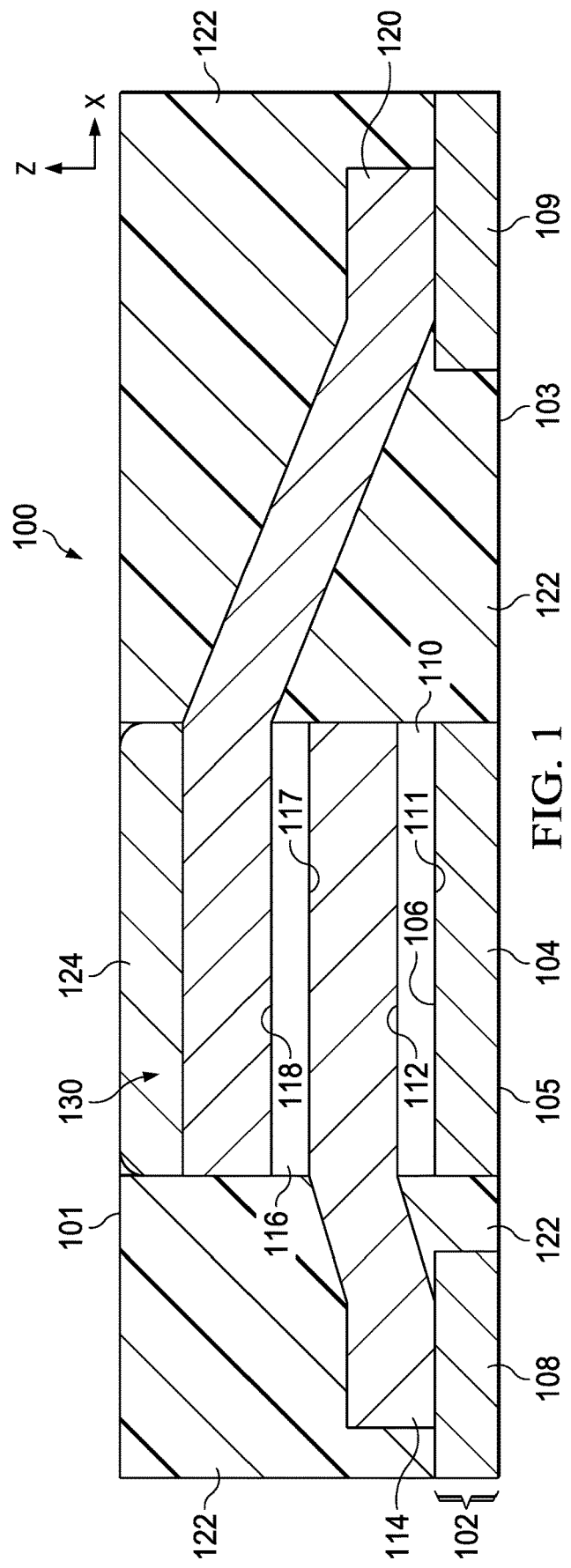
FIG. 1 is a partial sectional side elevation view of a packaged electronic device with a stacked power stage and a top-side solder structure taken along lines 1-1 in FIGS. 2 and 3.

In the drawings, like reference numerals refer to like elements throughout, and the various features are not necessarily drawn to scale. One or more operational characteristics of various circuits, systems and/or components are hereinafter described in the context of functions which in some cases result from configuration and/or interconnection of various structures when circuitry is powered and operating.

Electronic devices and fabrication methods are described, in which a conductive clip is exposed through a top-side opening of a molded package structure, and a solder structure is formed in the opening to provide a top-side thermal path with a connection for a user heatsink. Laser ablation is used in certain examples to create the opening that exposes a portion of a conductive clip through the top side of a molded packaged structure. Solder paste is deposited in the opening and reflowed to adhere to the exposed clip. Described examples provide a solution to expose the clip on the topside of the package to create a thermal path for heat conduction without mechanical buffing, so that no post-mold plating steps or equipment are needed.

Figure 2:
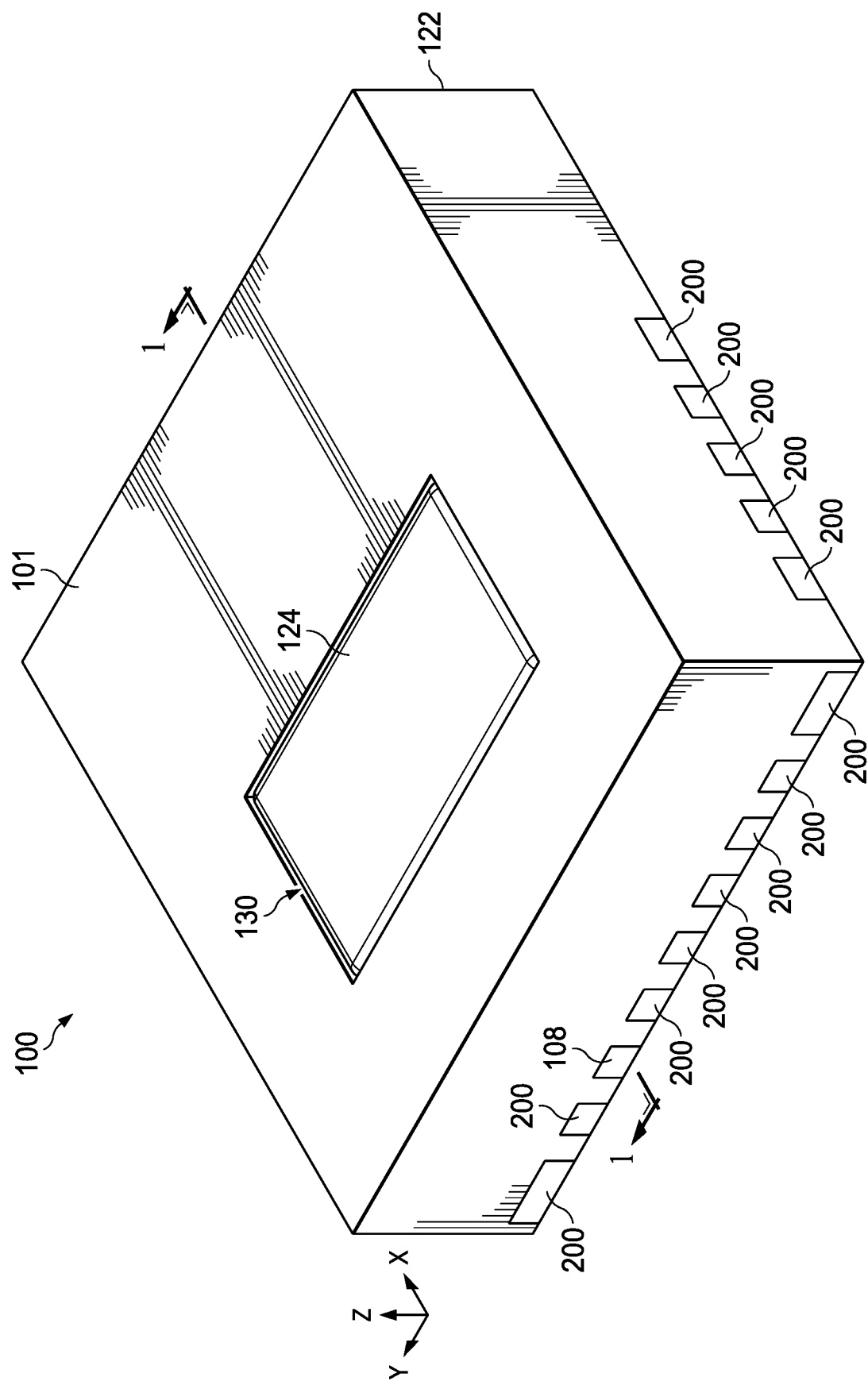
FIG. 2 is a top perspective view of the packaged electronic device of FIG. 1.
Figure 3:
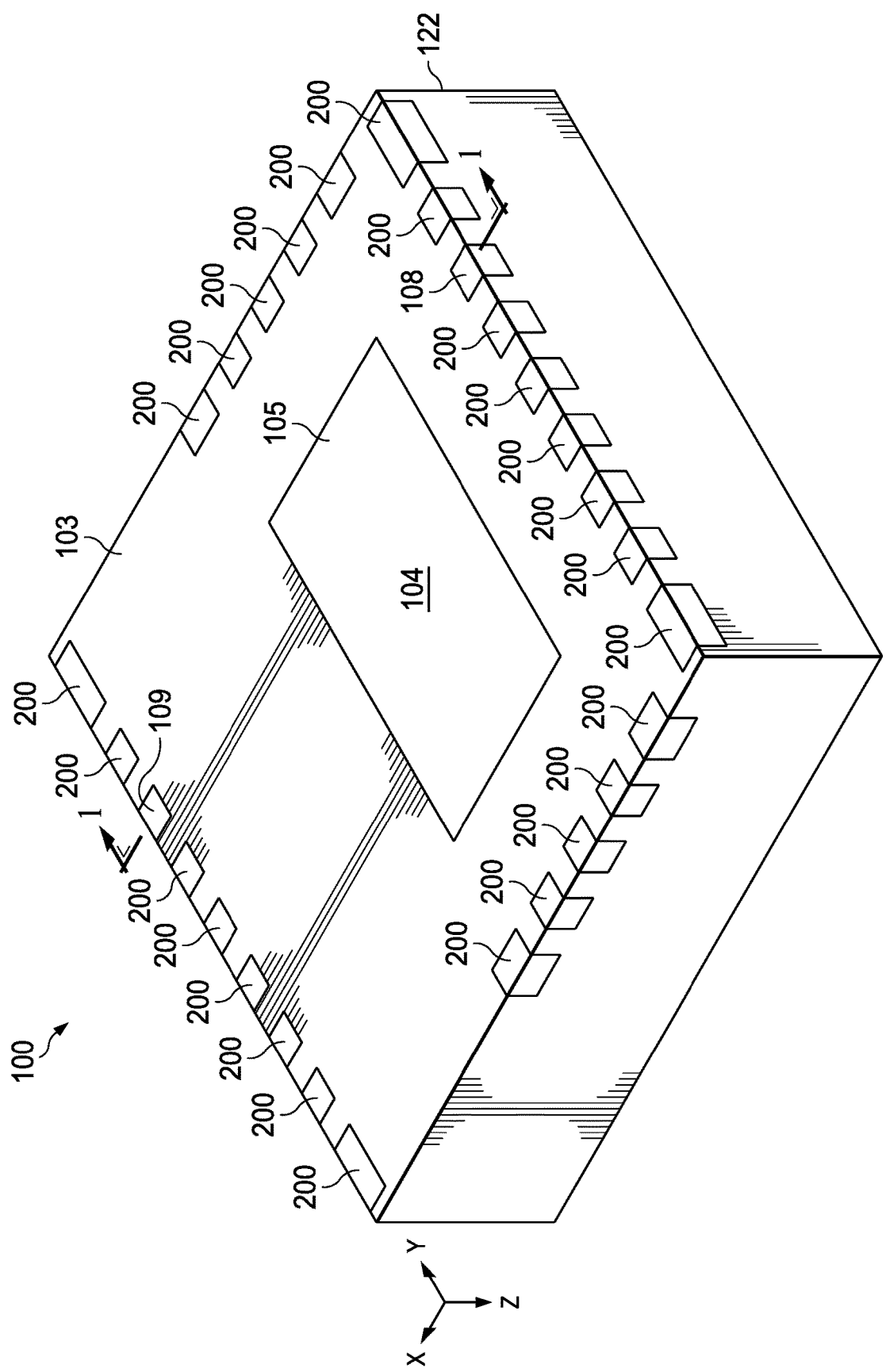
FIG. 3 is a bottom perspective view of the packaged electronic device of FIGS. 1 and 2.

FIGS. 1-3 show a packaged electronic device 100 with a stacked power stage and a solder structure along a top or first side 101 for removing heat from the transistors of the stacked power stage. The electronic device 100 includes electrically and thermally conductive metal features of a starting lead frame 102, one or more of which provide thermal heat removal from a bottom or second side 103 of the electronic device 100. The electronic device 100 includes a copper die attach pad (DAP) 104 having a bottom or first side 105 and a top or second side 106. The first side 105 of the die attach pad 104 is exposed along the second side 103 of the electronic device 100 to provide bottom-side cooling of the stacked power stage. The electronic device 100 includes multiple conductive copper leads, including a first lead 108 and a second lead 109 disposed along the second side 103 of the electronic device. The leads 108 and 109 are exposed along the second side 103 of the electronic device, and include sidewalls exposed along lateral sides of the electronic device 100. In use, the die attach pad 104 and the leads 108, 109 can be soldered to a host printed circuit board (PCB, not shown) to provide electrical connection of circuitry within the electronic device 100 with one or more circuit components (not shown) and interconnections of the host PCB.

The stacked power stage of the packaged electronic device 100 includes two semiconductor dies and two conductive clips forming a stacked arrangement above the die attach pad 104. A lower semiconductor die 110 includes a bottom or first side 111 and a top or second side 112. The first side 111 of the second semiconductor die 110 is disposed on the die attach pad 104. One or more conductive features (e.g., die pads or thermal pads) of the first side 111 of the semiconductor die 110 are soldered to the top side 106 of the die attach pad 104 to form electrical and thermal connections therewith.

A lower or bottom electrically and thermally conductive clip 114 includes a lower side soldered to one or more die pads or other conductive features of the second side 112 of the lower semiconductor die 110. In one example, the conductive clip 114 is or includes copper. In another example, the clip 114 is aluminum or other metal material that is thermally and electrically conductive. In addition, an extended portion of the clip 114 extends onto, and is soldered to, a top side of the first lead 108. An upper semiconductor die 116 includes a bottom or second side 117 and a top or first side 118. The conductive clip 114 has a second side on the second side 117 of the semiconductor die 116. As discussed further below in connection with FIG. 12, the semiconductor die 116 and the lower or second semiconductor die 110 include corresponding electronic components, such as field effect transistors to form a half-bridge switching circuit of the stacked power stage.

The packaged electronic device 100 in one example also includes one or more additional semiconductor dies, such as a controller circuit and a driver circuit in a third semiconductor die (not shown in FIGS. 1-3). The second side 117 of the semiconductor die 116 includes one or more die pads or thermal pads (not shown) soldered to a portion of the upper side of the lower conductive clip 114. In addition, the electronic device includes an upper conductive clip 120 on the first side 118 of the semiconductor die 116. In one example, the conductive clip 120 is or includes copper. In another example, the clip 120 is aluminum or other metal material that is thermally and electrically conductive. In one example, the first side of the semiconductor die 116 includes one or more die pads or thermal pads soldered to a portion of the lower side of the conductive clip 120. In addition, an extended portion of the clip 120 extends onto, and is soldered to, a top side of the second lead 109.

The electronic device 100 includes a package structure 122, such as a molded structure that is or includes a plastic or other molding compound. The package structure 122 encloses the lower semiconductor die 110, the lower clip 114, the upper semiconductor die 116, and the conductive clip 120. A first side of the die attach pad 104, the first lead 108, and the second lead 109 are exposed along a lower side of the package structure 122. In addition, the package structure 122 encloses portions of the die attach pad 104 and the leads 108, 109, while exposing portions thereof. The package structure 122 includes a top side that forms portions of the top side 101 of the electronic device 100.

The electronic device 100 provides top-side cooling via a solder structure 124 that extends on a top side of the conductive clip 120. The package structure 122 encloses lateral sides of the solder structure 124 and exposes a top portion of the solder structure 124 along the top side 101 of the electronic device 100. As shown in FIGS. 1 and 2, the package structure 122 has an opening 130 that extends between the conductive clip 120 and the top side 101 of the package structure 122. The solder structure 124 extends in the opening 130 to provide a top-side thermal path with a connection for a user heatsink (not shown).

FIG. 1 shows a sectional view of the packaged electronic device 100 taken along lines 1-1 in FIGS. 2 and 3. FIG. 2 shows a top perspective view of the packaged electronic device 100, and FIG. 3 shows a bottom perspective view of the packaged electronic device 100. As shown in FIG. 2, a top side of the solder structure 124 is exposed along the top side 101 of the electronic device 100 for top-side cooling of the stacked power stage. As shown in FIG. 3, the bottom side 105 of the die attach pad 104 is exposed along the bottom side 103 of the packaged electronic device 100 to provide bottom-side cooling of the stacked power stage. The packaged electronic device 100 also includes further conductive leads 200 shown in FIGS. 2 and 3 that provide electrical interconnection for other circuit components of the electronic device 100, such as power and signaling connections for a controller circuit and a driver circuit as discussed further below in connection with FIG. 12.

In one example, the package structure 122 is a molded material, such as plastic. In another example, a ceramic packaging material is used. The package structure 122 exposes bottom portions of the leads 108 and 109, as well as the bottom portion of the die attach pad 104, for example, to allow these features to be soldered to a host printed circuit board. In addition, side portions of the leads 108 and 109 are exposed in the illustrated example, although not a strict requirement of all possible implementations. The example packaged electronic device 100 in this example includes peripheral leads (e.g., 108 and 109 and others) exposed along the bottom side 103 and along lateral sides of a quad flat no lead (QFN) style package with device leads on four sides. In other examples, a different package style, form, etc. are used. In other examples, moreover, leads need not be provided on all four lateral sides of the package structure 122. In other implementations, bottom side cooling features (e.g., exposed portion of the die pad 104) are omitted.

Referring now to FIGS. 4-11, FIG. 4 shows a method 400 for fabricating a packaged electronic device, and FIGS. 5-11 show the electronic device in FIGS. 1-3 undergoing fabrication processing according to the method 400. The method 400 in one example includes laser ablation to remove molding compound from an area of the top side of the package structure 122 to expose an upper portion or side of the upper conductive clip 120. The method 400 also provides solder printing, screening, dispensing, or other deposition processing, to fully or partially fill the opening 130 with solder paste 124. In one example, the deposition fully fills the opening 130 to compensate the height of the removed mold compound, although not a strict requirement of all possible implementations. The deposited solder paste 124 in one example is deposited to cover any exposed portions of the top side of the conductive clip 120 to keep the copper form oxidizing. The method 400 facilitates provision of top-side cooling capability without the need for grinding tools and post mold plating, while providing a thermal path that can directly dissipate heat from the stacked power stage, or to which a heat sink can be soldered to further enhance top-side cooling.

Figure 5:
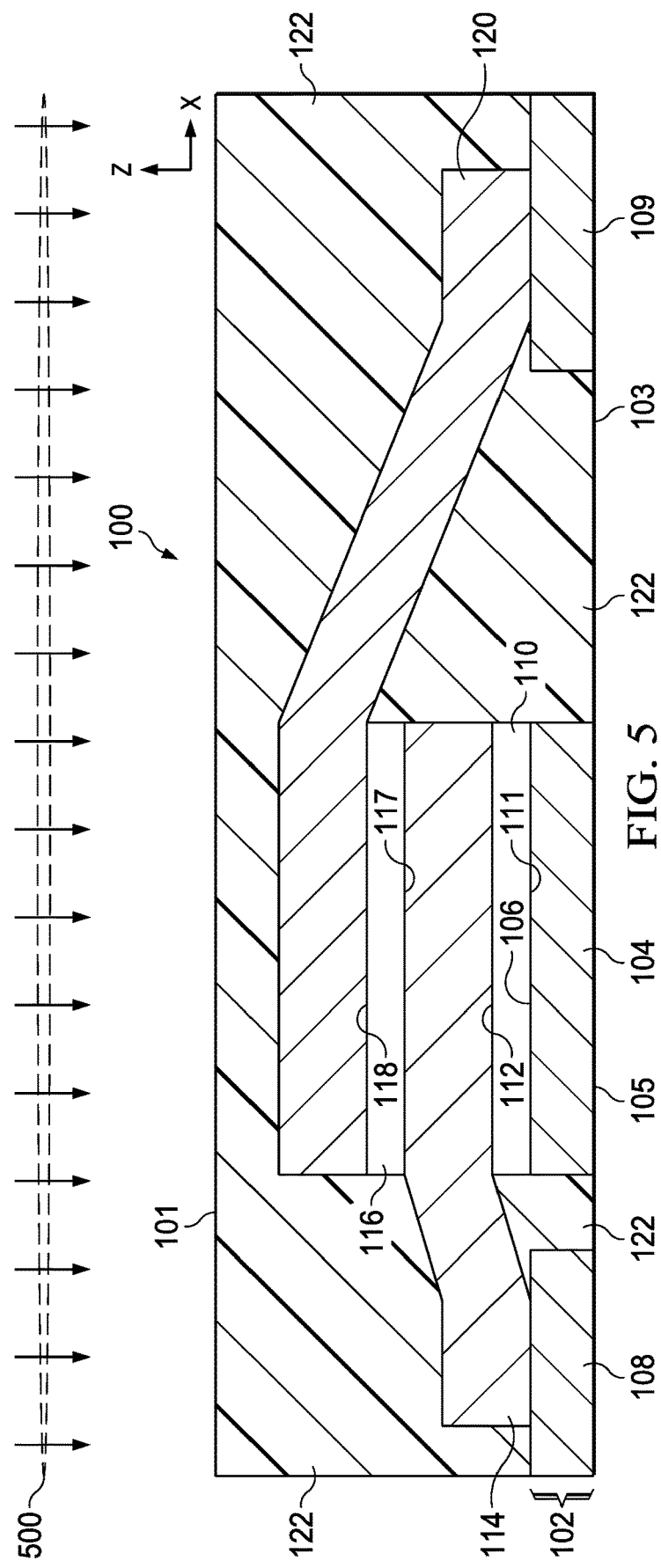
FIGS. 5-11 are partial sectional side elevation and top plan views of the electronic device in FIGS. 1-3 undergoing fabrication processing according to the method of FIG. 4.

The method 400 shows steps to initially create the stacked power stage at 401, and FIG. 5 shows the completed stacked power stage after molding. The stacked power stage fabrication at 401 includes attaching the semiconductor die 110 to the die attach pad 104 of the starting lead frame 102 at 402, and optionally attaching a controller/driver die (not shown) to a second die attach pad (not shown) of the lead frame. At 404, the conductive clip 114 is attached to the top side of the semiconductor die 110 and to the first lead 108 of the lead frame 102. At 405, the semiconductor die 116 is attached to the top side of the conductive clip 114. At 406, the upper conductive clip 120 is attached to the top side of the semiconductor die 116 and to the second lead 109 of the lead frame 102.

The attachments at 402-406 in one example include depositing conductive epoxy or solder paste to a feature, and placement of the corresponding clip or semiconductor die onto the conductive epoxy, for example, using automated pick and place machinery (not shown). After final attachment at 406 in one example, a thermal reflow process is performed to heat the assembly and solder various conductive features to one another by reflowing the conductive epoxy or solder paste. At 407 in FIG. 4, wire bonding is performed, for example, to electrically couple die pads or other conductive features of the controller chip to gate control terminals of the semiconductor dies 110 and 116 using conductive bond wires (not shown). At 408, a molding process 500 is performed to create the molded package structure 122 using a suitable mold (not shown). The molding process 500 completely covers the top side of the upper conductive clip 120 as shown in FIG. 5.

The method 400 continues at 410 with removing a portion of molding compound 122 from the top side 101 of the package structure 122 to create the opening 130 that exposes a portion of the top side of the conductive clip 120. The opening 130 is then filled with solder at 412, and the solder 124 is reflowed at 414. After reflowing, the solder 124 sets and acts as the connection to a subsequent the installed heat sink or operates to dissipate heat directly to the ambient environment of the finished packaged electronic device 100.

Figure 6:
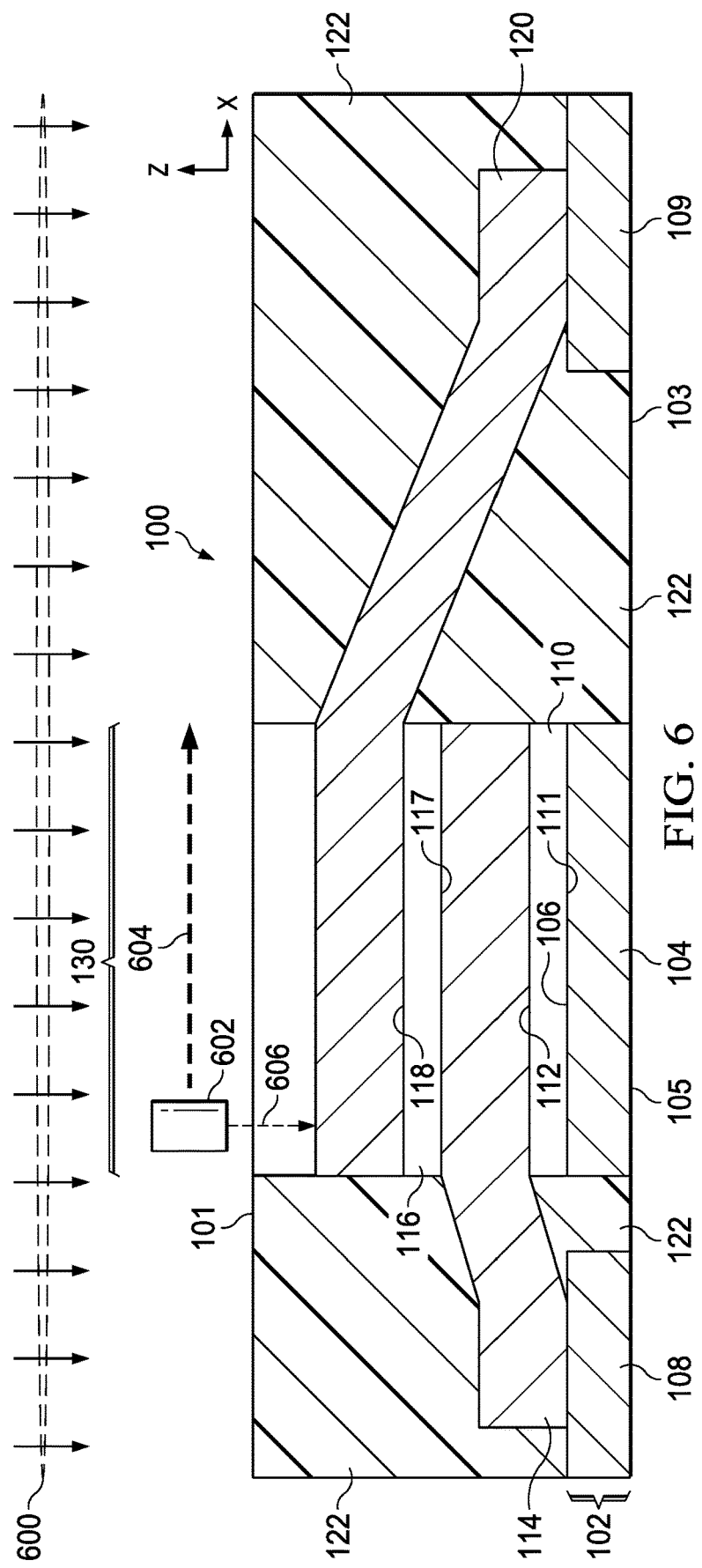
Figure 7:
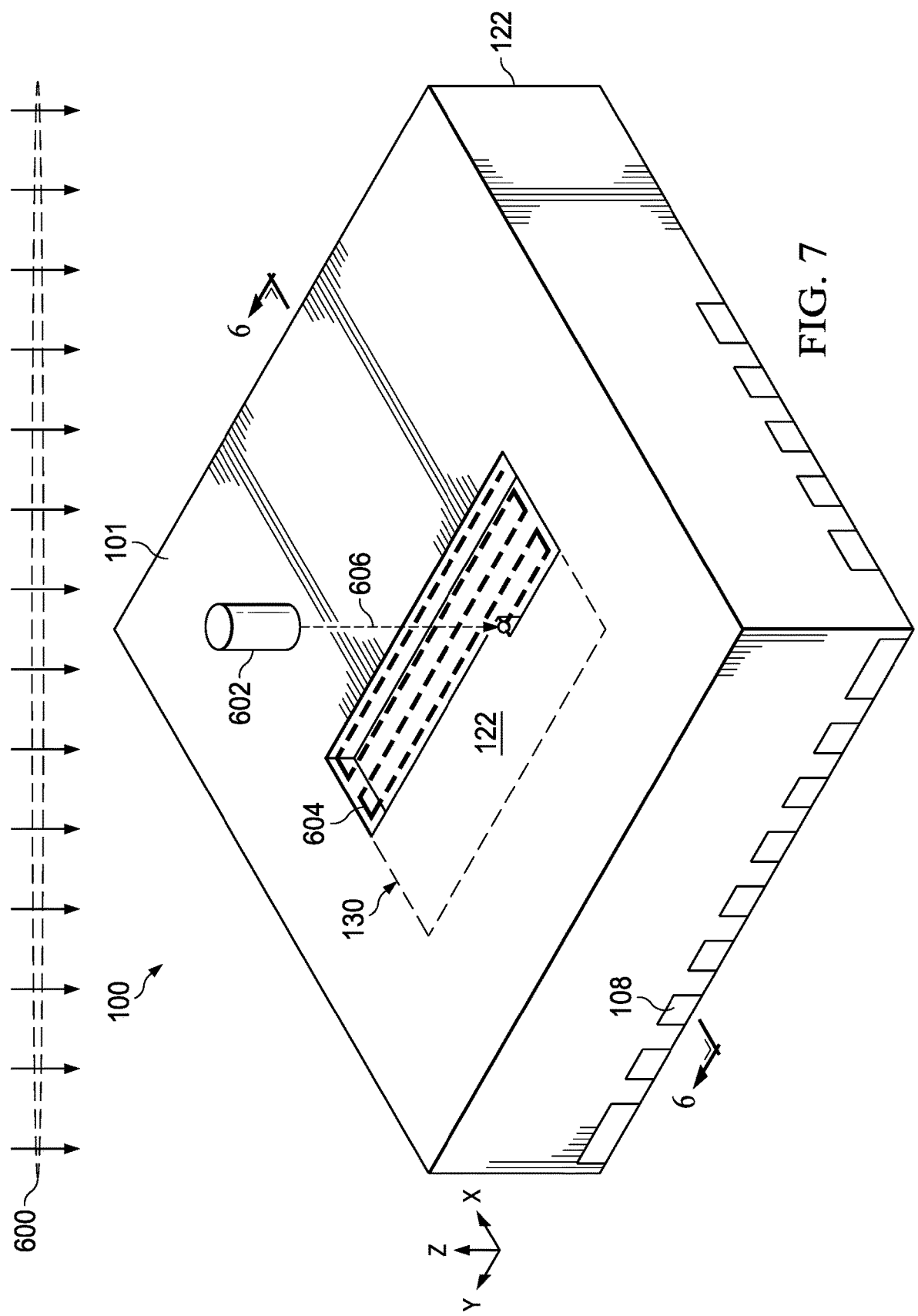

FIGS. 6 and 7 show one example of the molding material removal at 410, in which a laser ablation (also referred to as photoablation) process 600 is performed that removes a select portion of the molding compound from the side 101 of the package structure 122 to create the opening 130 that exposes a portion of the conductive clip 120. In one example, the laser ablation process 600 is a pulsed laser ablation process 600. In another implementation, the laser ablation process 600 is a continuous application of a laser beam to the selected portion of the molding compound. As shown in the example of FIGS. 6 and 7, a laser 602 is translated in the X-Y plane along a raster scan path 604 while spaced along the Z direction (FIG. 7) above the top side 101 of the electronic device 100 while applying a continuous or pulsed laser beam 606 to the molding compound. The laser 602 in this example is raster scanned along a portion of the top side 101 of the package structure 122 to create the opening 130 that exposes the portion of the conductive clip 120. The laser ablation process 600 in one example removes or destroys molding compound material from a portion of the top side of the conductive clip 120 by vaporization, chipping, or other erosive mechanisms resulting from application of the laser beam 606.

The raster scanning speed of the laser 602, the energy and wavelength of the applied laser beam 606, and other processing parameters of the laser ablation process 600 can be tailored to a given size of the opening 130 and the depth from the top side 101 of the package structure 122 to the subsequently exposed top side of the conductive clip 120. At low laser flux, the material is heated by the absorbed laser energy and evaporates or sublimates. At higher laser flux settings, the material is converted to a plasma. The laser ablation process 600 can be performed in a controlled environment, such as a processing chamber with controlled temperature and pressure. In one example, the laser ablation process 600 removes the designated molding compound material with a pulsed laser beam 606. In another example, the desired molding compound material is ablated with a continuous wave laser beam 606 of suitable intensity according to the material of the package structure 122 and the depth of the desired opening 130.

In one example, the wavelength of the laser beam 606 is approximately 200 nm. In other examples, a different wavelength is used, such as deep ultra-violet light. In one example, short laser pulses are used such that ablation occurs in a narrow region and the surrounding material absorbs little heat, and the raster scan path 604 is programmed into a robotic control arm that controls the position of the laser 602 in order to create the opening 130 of any desired shape. The illustrated opening 130 is generally rectangular to accommodate a standard heatsink, although other examples use a different raster scan path 6042 create a desired shape. The laser ablation process 600 advantageously avoids the use of chemicals or other solvents to create the opening 130 and mitigates or avoids the above-mentioned shortcomings of buffing processes, and the costs and process complexity associated with plating processes.

Figure 4:
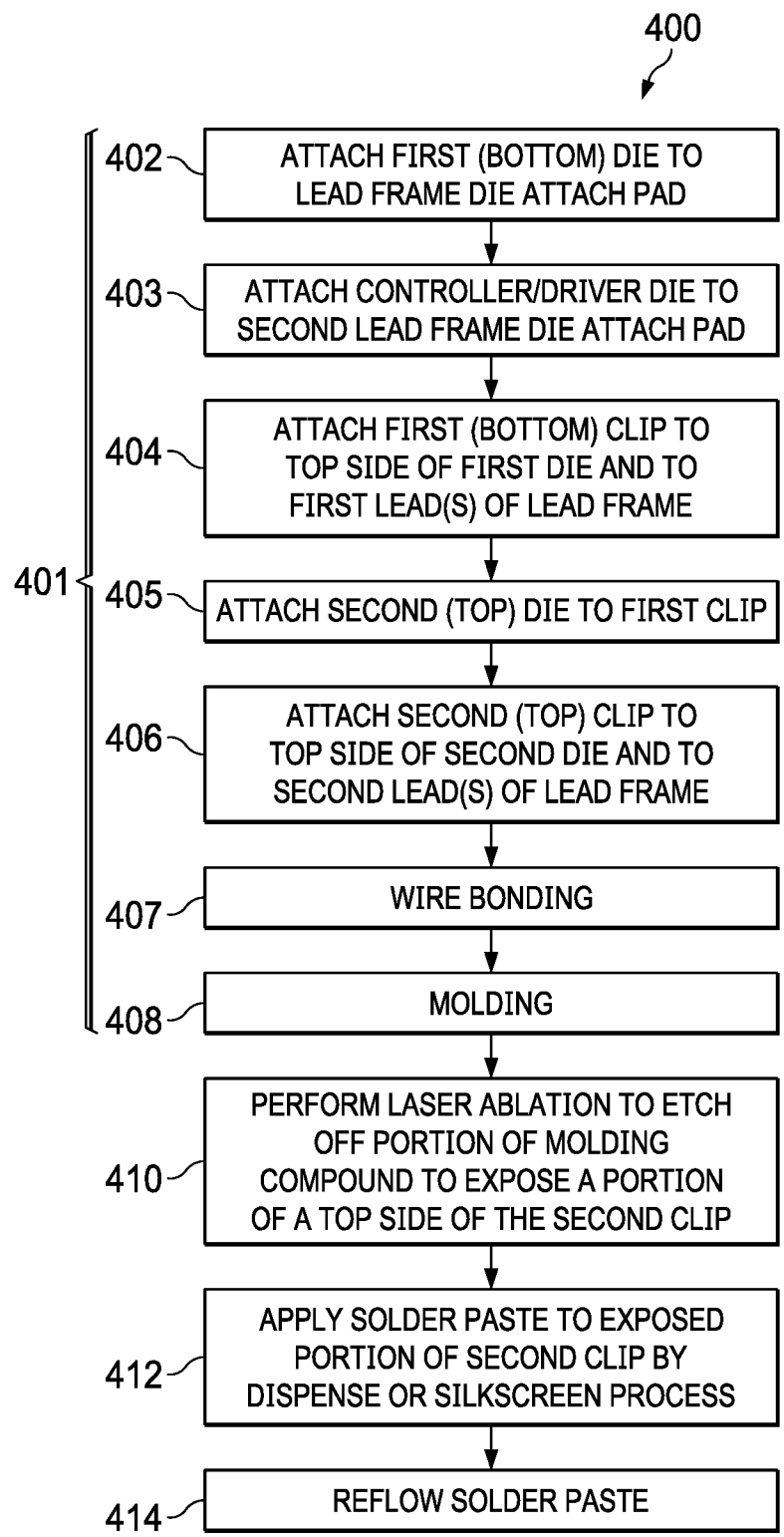
FIG. 4 is a flow diagram of a method to fabricate an electronic device.
Figure 8:
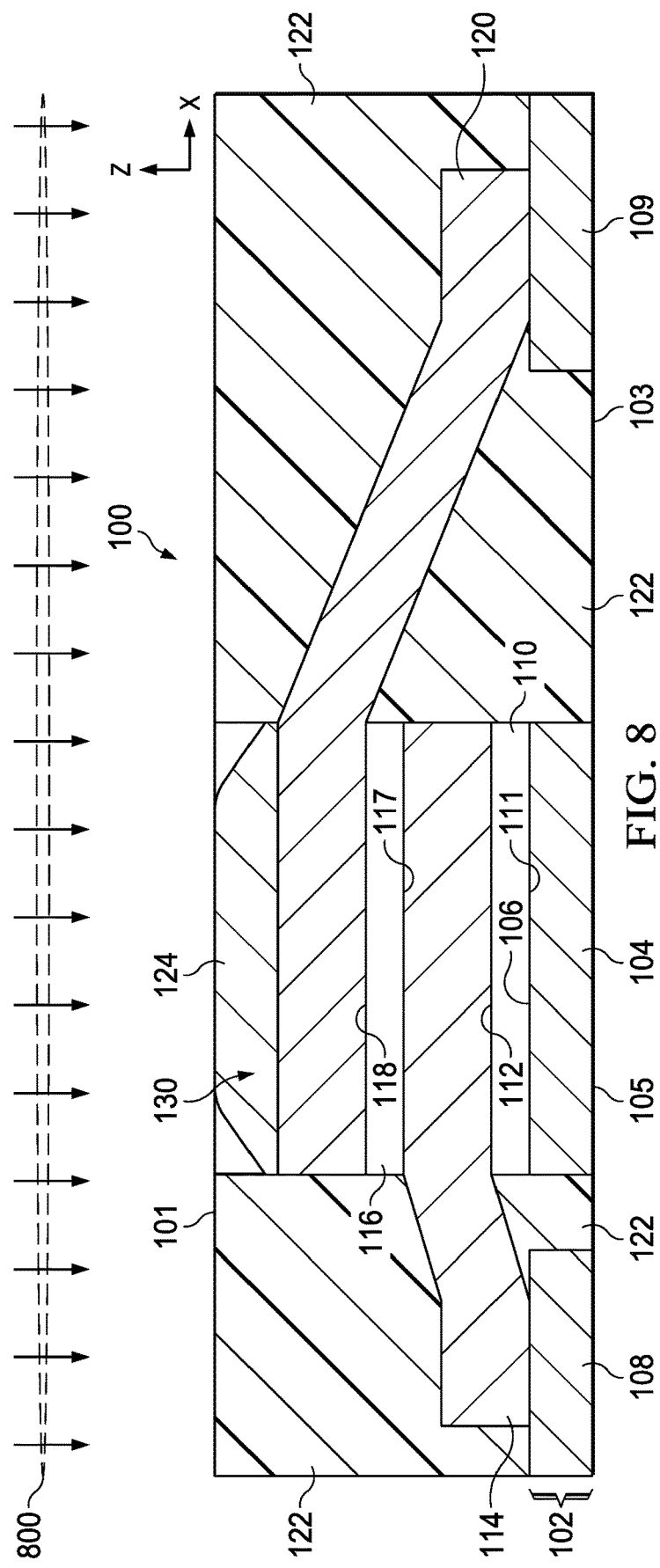
Figure 9:
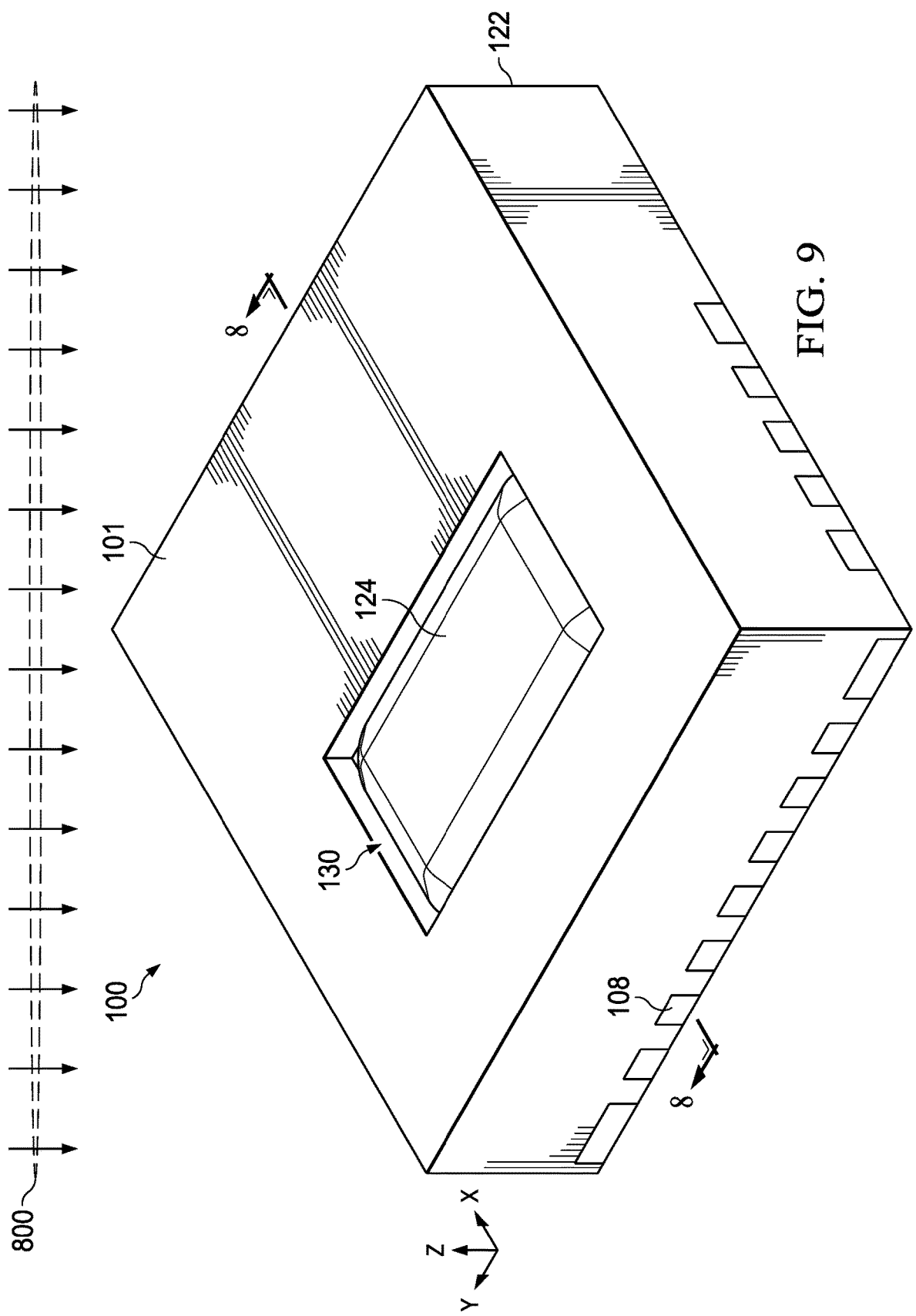

The method 400 continues in FIG. 4 at 412 with depositing solder paste 124 on the exposed portion of the conductive clip 120. FIGS. 8 and 9 show one example, in which a deposition process 800 is performed that deposits solder paste or other suitable solder material 124 into the opening 130. Suitable examples of the deposition process 800 include printing, screening, dispensing, or other deposition processing that fully or partially fills the opening 130 with solder material 124. In one example, the deposited material is liquid or semi-liquid solder paste 124. In one example, the application of solder paste at 412 includes performing 412 a dispense process 800 that dispenses the solder paste 124 in the opening 130 onto the exposed portion of the conductive clip 120. In another example, the deposition at 412 includes a screen printing or screening process 800 that deposits the solder paste 124 in the opening 130 onto the exposed portion of the conductive clip 120.

Figure 10:
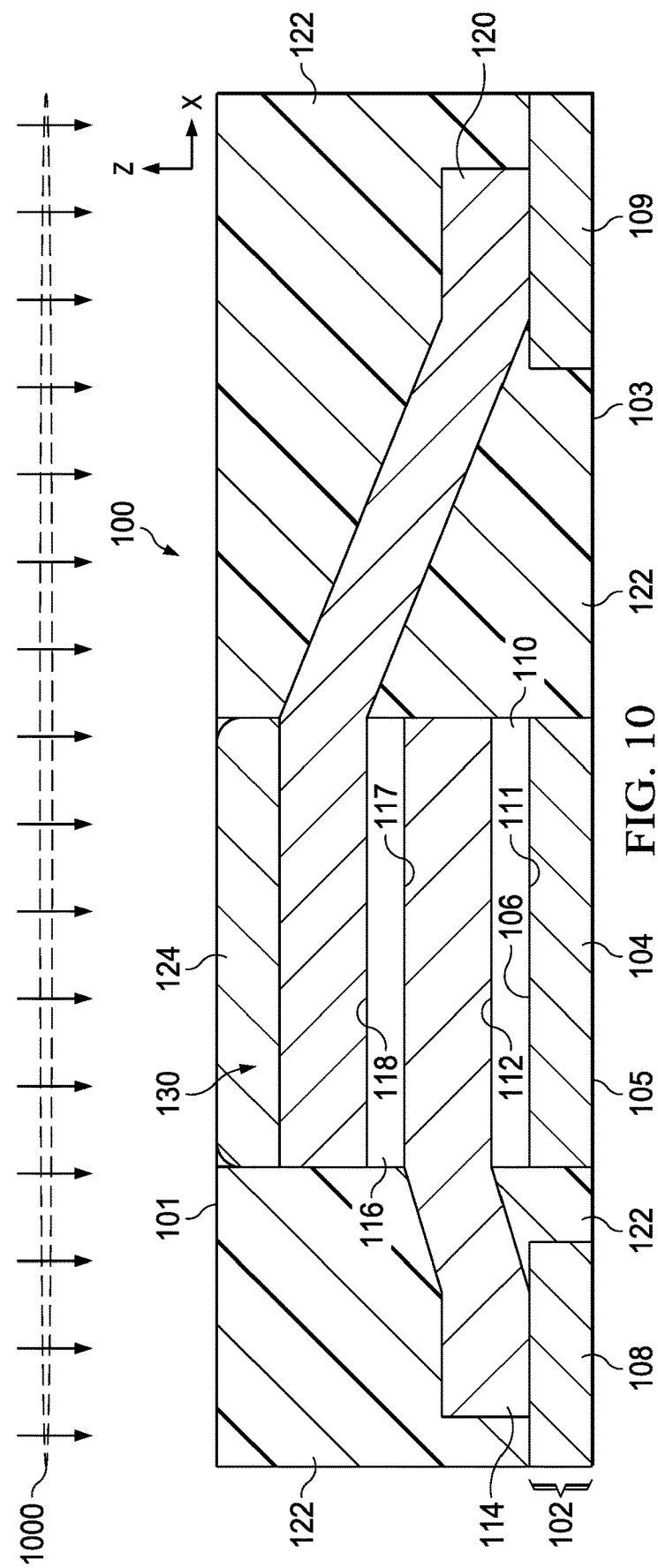
Figure 11:
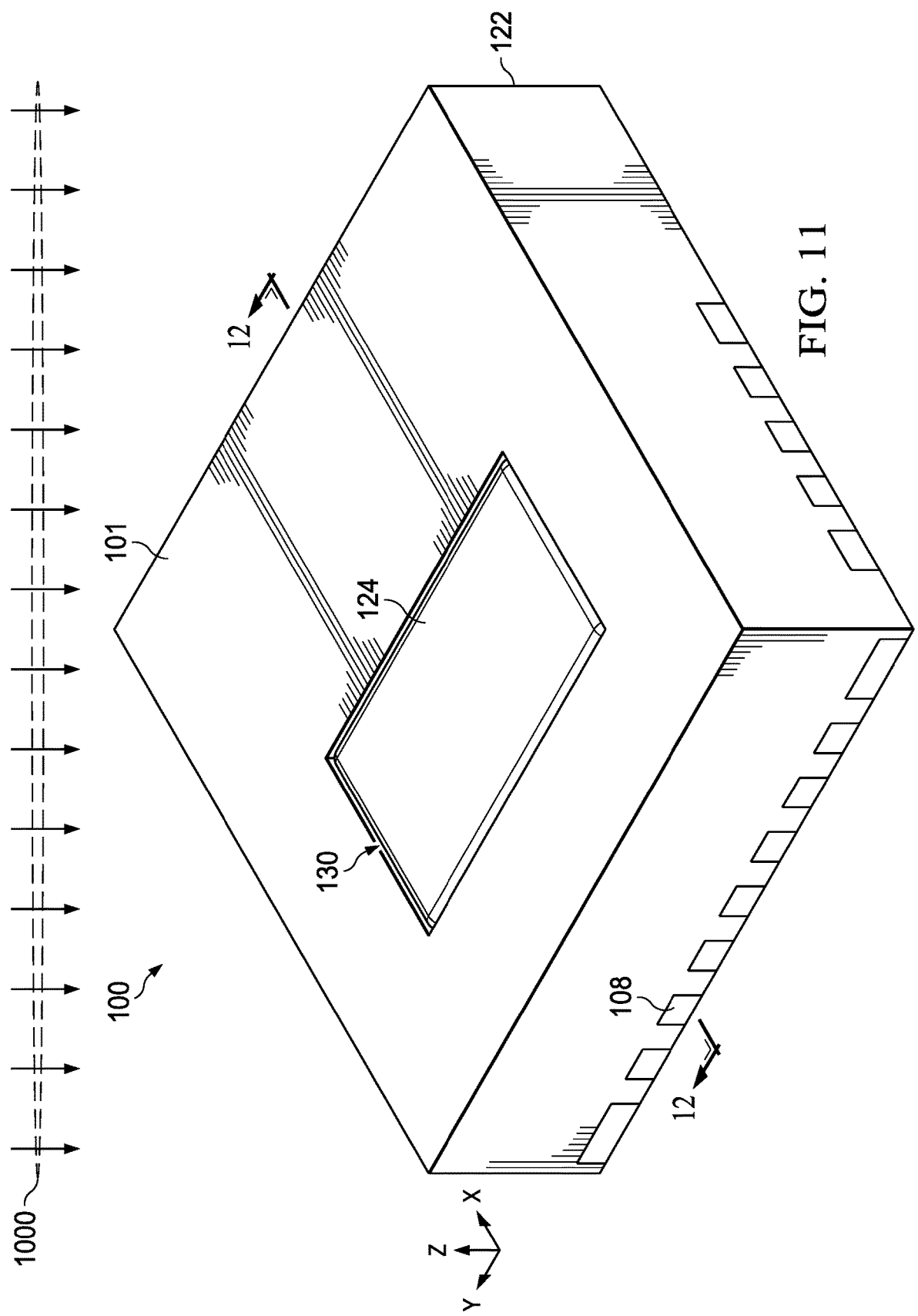

At 414 in FIG. 4, the method 400 includes reflowing the solder paste. FIGS. 10 and 11 show one example, in which a thermal reflow process 1000 is performed that the flows the solder paste 214. The reflow process 1000 melts the solder paste material 214, and removal of the heat after the process 1000 allows the material 214 to preferentially form on the top side of the conductive clip 120. In this regard, if the formed opening 130 exposes portions of the molding compound 122 laterally outward of the extent of the conductive clip 120, the reflow process 1000 may cause the re-melted material 214 to flow preferentially over the copper material of the conductive clip 120.

Figure 12:
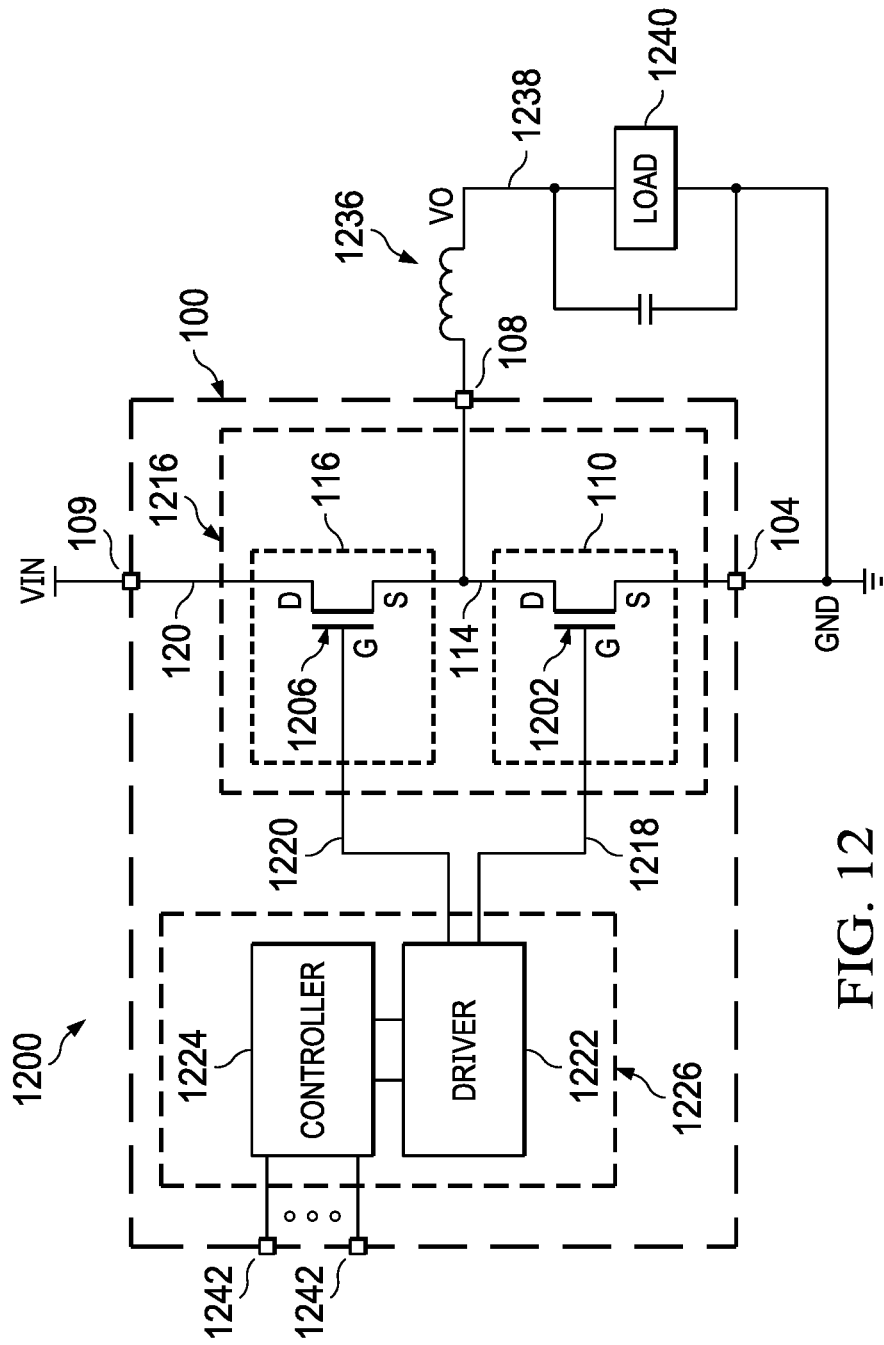
FIG. 12 is a schematic diagram of a DC-DC converter that includes the packaged power stage electronic device of FIGS. 1-3 with an integrated controller and driver die.

FIG. 12 shows a partial schematic representation of a DC-DC converter circuit 1200 that includes the packaged power stage electronic device 100 with an integrated controller and driver circuit formed in a third die for a driver circuit and/or a control circuit. As schematically shown in FIG. 12, the package electronic device 100 includes the semiconductor dies 110 and 116, as well as the conductive clips 114 and 120. The semiconductor dies 110 and 116 and the clips 114 and 120 form a stacked power stage 1216 schematically indicated in FIG. 12. The electronic device 100 also includes the first and second leads 108 and 109, as well as the die attach pad 104 as previously described in connection with FIGS. 1-3. In this example, the first semiconductor die 116 includes a first transistor 1206. The transistor 1206 in this example is a field effect transistor (FET) that includes a drain D coupled through the conductive clip 120 to the solder structure 124 and to the second lead 109. The transistor 1206 also includes a source S coupled through the conductive clip 114 to the first lead 108, and a gate control terminal G coupled to an output 220 of a driver circuit 1222.

The driver circuit 1222 is coupled to a controller circuit 1224. In one example, the driver circuit 1222 in the controller circuit 1224 are formed in a single semiconductor die 1226 that is mounted to a die attach pad in the package electronic device 100 (not shown). The controller circuit 1224 in one example is a pulse width modulation controller that provides switching control signals to the driver circuit 1222. The driver circuit 1222 generates gate drive signals at the output to control the gate control terminal G of the transistor 1206. The controller circuit 1224 in one example includes one or more control and/or power inputs connected to corresponding leads 200 exposed along the bottom and lateral sides of the package structure 122 in FIGS. 2 and 3 above.

The semiconductor die 110 in FIG. 12 includes a second FET transistor 1202 that includes a drain D coupled to the first lead 108 and to the source of the first transistor 1206 through the conductive clip 114. The second transistor 1202 also includes a source S coupled to the die attach pad 104, and a gate control terminal G coupled to a second output 1218 of the driver circuit 1222.

The example circuit 1200 in FIG. 12 is a DC-DC buck converter that includes the packaged power stage electronic device 100, as well as an output inductor 1236 coupled between the first lead 108 and an output node 1238 to control an output voltage signal VO across a load 1240. In the illustrated example, the first and second FETs 1202 and 1206 are n-channel MOSFET devices (NMOS). In another example, one or both FETs 1202, 1206 can be p-channel MOSFET devices (PMOS, not shown). The FETs 1202 and 1206 in FIG. 12 are connected as low and high-side switches, respectively, in a buck converter arrangement. In this configuration, the input node formed by the second lead 109 is connected to receive a DC input voltage signal VIN, and a reference node formed by the die attach pad 104 is connected to a ground or other reference voltage node (e.g., labeled GND in FIG. 12). In other examples, the first and second FETs can be connected in a boost converter configuration, a buck-boost configuration, or other circuit arrangement (not shown).

In one example, the driver circuit 1222 includes amplifier circuits, level shifting circuits, and/or other suitable circuitry (not shown) to provide switching control signals to the switch control nodes 1218 and 1220 in order to operate the respective first and second FETs 1202 and 1206. The control circuit 1224 (labeled CONTROLLER) provides pulse width modulated signals to the driver circuit 1222 to implement open or closed loop control of the output signal VO by selective operation of the FETs 1202 and 1206. In one implementation, the outputs 1218 and 1220 of the driver circuit 1222 are connected to the respective semiconductor dies 110 and 116 by bond wires (not shown), and the controller signal connections from the controller circuit 1224 are interconnected to the corresponding device leads 200 by bond wires (not shown) in the packaged electronic device 100.

In one example, the driver circuit 1222 and the control circuit 1224 are integrated in a third semiconductor die 1226. In this example, the semiconductor die 110, the second die 116 and the third die 1226 are packaged in a single package structure 122 as shown in FIGS. 1-3 above that encloses the semiconductor die 110 including the FET 1202, the semiconductor die 116 including the second FET 1206, and the third die 1226 including the driver circuit 1222 and the controller circuit 1224. In another example, the controller circuit 1224 can be omitted from the packaged electronic device 100, and the driver circuit 1222 is provided with external connections to receive pulse width modulated signals from which the switch control signals are generated to operate the FETs 1202 and 1206. In another implementation, the driver circuit 1222 and the control circuit 1224 can be omitted from the packaged electronic device 100, and the device 100 includes external connections to receive signals at the first and second switch control nodes 1218 and 1220.

The electronic device 100 in FIG. 12 includes externally accessible electrical connections, referred to herein as leads (e.g., pins, pads, etc.) that allow electrical interconnection of the device 100 with external circuitry. The conductive clip 114 is connected through the first lead 108 to the switching node of the buck converter configuration. This allows connection of an external inductor 1236 between the switching node and a DC-DC converter output node 1238. In operation in this example, the FETs 1202 and 1206 operate as low and high-side drivers according to switching control signals from the driver circuit 1222 to modulate the voltage of the switching node at the first lead 108. The output node 1238 provides a DC output voltage signal VO to the load 1240 connected between the output node 1238 and the reference node at the die attach pad 104 (e.g., GND). Modulation of a pulse width of the switching control signals 1223 operates to control the amplitude of the DC output voltage signal VO. The packaged electronic device 100 in this example also includes one or more additional terminals 200 connected to the control circuit 1224. The terminals 200 in one example can be used to provide one or more feedback or other control signals or power supply and ground (e.g., output voltage VO, output current, input set point signal, etc.) for closed-loop operation of the buck DC-DC converter. The control circuit 1224 in one example implements proportional-integral (PI), proportional-integral-derivative (PID) or other suitable regulation functions to regulate one or more measured operating conditions (e.g., output voltage amplitude, output current, etc.) with respect to a setpoint or other internal or external reference (not shown).

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. A method, comprising:
   performing a laser ablation process that removes a portion of molding compound from a side of a package structure to create an opening that exposes a portion of a conductive clip;
   depositing solder paste on the exposed portion of the conductive clip; and
   reflowing the solder paste.

2. The method of claim 1, wherein the laser ablation process is a pulsed laser ablation process.

3. The method of claim 1, wherein performing the laser ablation process comprises:
   raster scanning a laser along a portion of the side of the package structure to create the opening that exposes the portion of the conductive clip.

4. The method of claim 1, wherein depositing the solder paste on the exposed portion of the conductive clip comprises:
   performing a dispense process that dispenses the solder paste in the opening onto the exposed portion of the conductive clip.

5. The method of claim 1, wherein depositing the solder paste on the exposed portion of the conductive clip comprises:
   performing a screening process that deposits the solder paste in the opening onto the exposed portion of the conductive clip.

6. The method of claim 1, wherein depositing the solder paste on the exposed portion of the conductive clip comprises:
   performing a dispense process that dispenses the solder paste in the opening onto the exposed portion of the conductive clip.

7. The method of claim 1, wherein depositing the solder paste on the exposed portion of the conductive clip comprises:
   performing a screening process that deposits the solder paste in the opening onto the exposed portion of the conductive clip.

8. A method, comprising:
   forming a semiconductor die having an electronic component;
   attaching a conductive clip on a side of the semiconductor die;
   forming a solder structure on a side of the conductive clip; and
   enclosing the semiconductor die and the conductive clip with a package structure, the package structure having a side that exposes a portion of the solder structure.

9. The method of claim 8, further comprising exposing a first lead along a second side of the package structure, and a exposing a second lead along the second side of the package structure.

10. The method of claim 9, further comprising:
    providing a die attach pad having a first side exposed along the second side of the package structure;
    attaching to the die attach pad a first side of a second semiconductor die having the first side, a second side, and a second electronic component;
    coupling a second conductive clip to the first lead, the second conductive clip having a first side on the second side of the second semiconductor die, and a second side on a second side of the semiconductor die; and
    coupling the conductive clip to the second lead.

11. The method of claim 10, wherein:
    the electronic component of the semiconductor die is a field effect transistor having a drain coupled to the conductive clip, and a source coupled to the second conductive clip; and
    the second electronic component of the second semiconductor die is a second field effect transistor having a drain coupled to the second conductive clip, and a source coupled to the die attach pad.

12. The method of claim 10, wherein:
    the package structure has an opening between the conductive clip and the side of the package structure; and
    the solder structure extends in the opening.

13. The method of claim 8, further comprising:
    a die attach pad having a first side exposed along a second side of the package structure;
    a second semiconductor die having a first side on the die attach pad, a second side, and a second electronic component; and
    a second conductive clip having a first side on the second side of the second semiconductor die, and a second side on a second side of the semiconductor die.

14. The method of claim 13, wherein:
    the electronic component of the semiconductor die is a field effect transistor having a drain coupled to the conductive clip, and a source coupled to the second conductive clip; and
    the second electronic component of the second semiconductor die is a second field effect transistor having a drain coupled to the second conductive clip, and a source coupled to the die attach pad.

15. The method of claim 8, wherein:
    the package structure has an opening between the conductive clip and the side of the package structure; and
    the solder structure extends in the opening.

16. A method of making an electronic device, comprising:
    forming a package structure having a first side that includes an opening, and an opposite second side;
    forming a solder structure in the opening, the solder structure exposed along the first side of the package structure;
    providing a die attach pad having a first side exposed along the second side of the package structure;
    exposing a first lead along the second side of the package structure;

exposing a second lead along the second side of the package structure;
coupling a first transistor having a drain to the solder structure and to the second lead, and a source coupled to the first lead; and
coupling a drain of a second transistor to the first lead, and a source to the die attach pad.

17. A method, comprising:
forming a package structure having a first side that includes an opening, and an opposite second side;
forming a solder structure in the opening, the solder structure exposed along the first side of the package structure;
providing a die attach pad having a first side exposed along the second side of the package structure;
exposing a first lead along the second side of the package structure;
exposing a second lead along the second side of the package structure;
forming a first transistor having a drain coupled to the solder structure and to the second lead, and a source coupled to the first lead;
forming a second transistor having a drain coupled to the first lead, and a source coupled to the die attach pad; and
forming a control circuit in the package structure, the control circuit having a first output coupled to a gate of the first transistor, and a second output coupled to a gate of the second transistor.

18. The method of claim 16, further comprising:
coupling a conductive clip to: the drain of the first transistor, the solder structure, and the second lead.

19. The method of claim 18, further comprising:
coupling a second conductive clip coupled to: the drain of the second transistor, the first lead, and the source of the first transistor.

20. A method of making an electronic device, comprising:
forming a package structure having an opening exposing a portion of a conductive clip; and
forming a solder structure on the exposed portion of the conductive clip from the conductive clip to a surface of the package structure.

21. A method, comprising:
forming a semiconductor die having an electronic component;
attaching a conductive clip on a side of the semiconductor die;
forming a solder structure on a side of the conductive clip; and
covering the semiconductor die and the conductive clip with a package structure, the package structure having a side that exposes a portion of the solder structure.

* * * * *